United States Patent [19]

Nakamura

[11] 4,193,008
[45] Mar. 11, 1980

[54] TUNING FORK FORMED OF ROLLED INVARIABLE ELASTICITY MATERIAL

[75] Inventor: Takeshi Nakamura, Uji, Japan

[73] Assignee: Murata Manufacturing Co., Ltd., Kyoto, Japan

[21] Appl. No.: 892,946

[22] Filed: Apr. 3, 1978

[30] Foreign Application Priority Data

Apr. 18, 1977 [JP] Japan ............................ 52-49029[U]

[51] Int. Cl.² .............................................. H01L 41/10
[52] U.S. Cl. ........................................ 310/321; 310/25
[58] Field of Search ................... 310/321, 26, 370, 25; 84/409, 457; 58/23 TF

[56] References Cited

U.S. PATENT DOCUMENTS

| 3,782,209 | 1/1974 | Favre | 310/25 X |
| 3,797,224 | 3/1974 | Favre | 58/23 TF |

*Primary Examiner*—Mark O. Budd
*Attorney, Agent, or Firm*—Birch, Stewart, Kolasch & Birch

[57] ABSTRACT

A tuning fork and a manufacturing method thereof which is obtained by punching and folding a material of invariable elasticity. The material is formed in the shape of a plate and processed through a rolling operation, wherein the plate is punched into an approximately V-shape such that the folding line appears at a right angle with respect to the rolling direction of the plate. A piezoelectric element serving as an electrical mechanical conversion device is provided on a vibrating portion.

9 Claims, 10 Drawing Figures

U.S. Patent  Mar. 11, 1980  Sheet 1 of 2  4,193,008
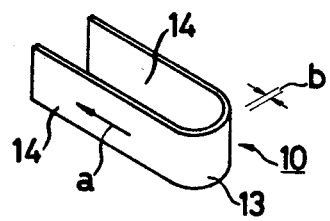
FIG. 1
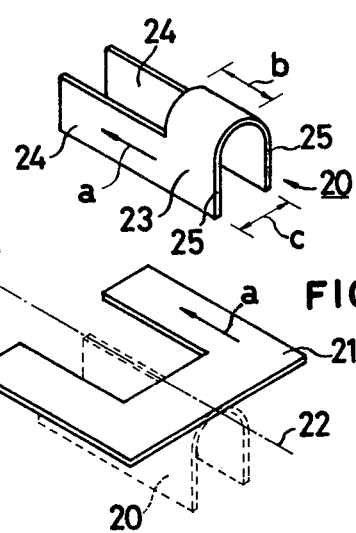
FIG. 2
FIG. 3
FIG. 4
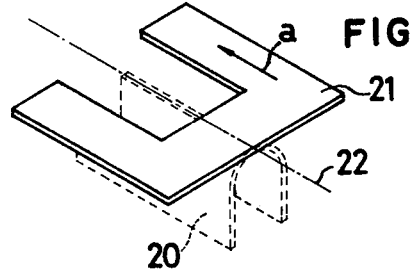
FIG. 5
FIG. 6
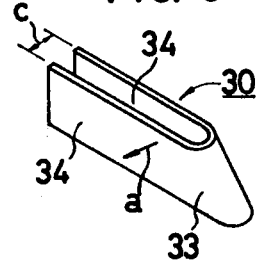
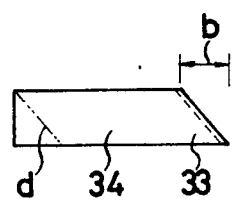

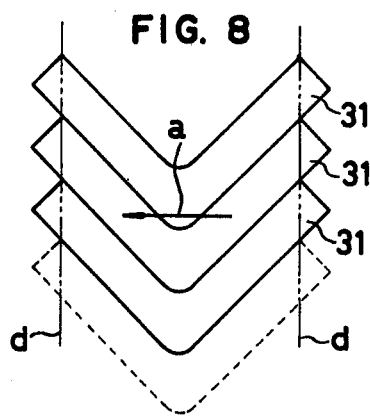
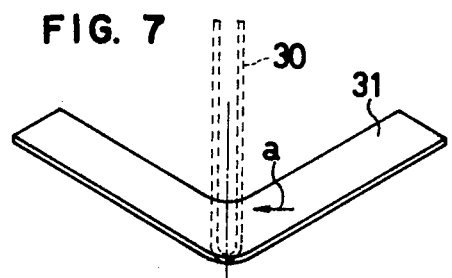
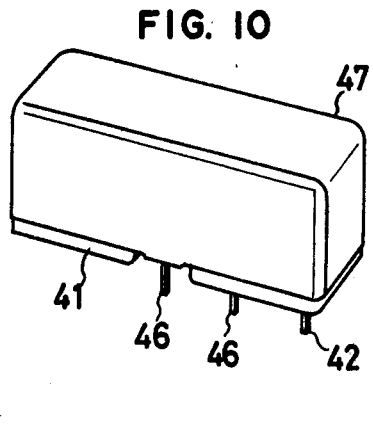
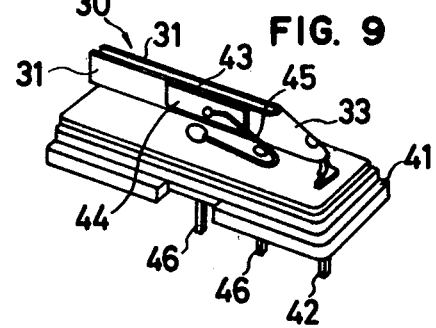

TUNING FORK FORMED OF ROLLED INVARIABLE ELASTICITY MATERIAL

BACKGROUND OF THE INVENTION

1. Field of the Invention

The present invention relates to a tuning fork and a manufacturing method thereof. More particularly, the present invention relates to a tuning fork produced through the folding of a plate-like material of invariable elasticity and a manufacturing method thereof.

2. Description of the Prior Art

An extremely small-sized tuning fork for use in tuning forks of a piezo-electric type, electromagnetic type and the like is made of a material of invariable elasticity such as elinvar which is superior in an impact characteristic. One method of manufacturing such a tuning fork comprises the steps of punching a material formed into a plate through a rolling operation and folding it. Another method thereof comprises the steps of cutting and machining the material. The tuning fork by the former method will be described later. The tuning fork by the latter method is advantageous in that it can be formed into an optional shape, but is disadvantageous in that the costs for the material and for machining the material is higher. The tuning fork by the former method will be described hereinafter with reference to FIGS. 1 through 4.

FIG. 1 is a perspective view showing a first typical conventional example of such a tuning fork. FIG. 2 is a perspective view illustrating a machining process for the tuning fork. In general, a rolling operation applied to a material gives rise to a residual stress in the rolling direction in the material, which enhances a strength to the bending. Such a tuning fork 10 as shown hereinabove is formed through folding, along a folding line 12, of a blank 11 which has been punched into an elongated rectangular shape extending in a rolling direction as shown in an arrow "a". The portion along the folding line 12 forms a base portion 13 of the tuning fork. Both side portions of the blank form vibrating leg portions 14 and 14 of the tuning fork.

FIG. 3 is a perspective view showing a second typical conventional example. FIG. 4 is a perspective view illustrating a manufacturing process of the tuning fork. A tuning fork 20 shown in FIG. 4 is formed through folding, along a folding line 22, of a U-shaped blank which has been punched such that its end portions extend in a rolling direction as shown by arrow "a". The bent portion forms a base portion of the tuning fork. The bifurcate portions, each extending straightly along its end direction from the base portion 23, form the vibrating leg portions 24 and 24, respectively.

Generally, to improve the quality factor Q of the tuning fork and to stabilize the characteristics such as a time dependent characteristic and impact characteristics, it is preferable to increase the thickness of the base portion of the tuning fork and the strength of the vibrating leg portions. From this point of view, the tuning fork 10 and the tuning fork 20 provide an increased strength of the respective vibrating leg portions, inasmuch as these have the vibrating leg portions 14 and 14 extended in the rolling direction "a". However, in the tuning fork 10 (FIG. 1), the thickness of the base portion 13 of the tuning fork is determined by the thickness "b" of the blank 11 per se, which means that the thickness of the base portion is limited. As a result, the quality factor Q cannot be improved and the characteristics as described hereinabove cannot be stabilized. On the other hand, since in the tuning fork 20 (FIG. 3) the thickness "b" of the base portion 23 can be selected as desired depending on the punched shape of the blank 21, the quality factor Q can be improved and the characteristics as described hereinabove can be stabilized. Nevertheless, as apparent from the shape of the tuning fork 20 and the shape of the blank 21, the tuning fork 20 is disadvantageous in that it is of inferior workability and further results in an increased material loss as compared with the tuning fork 10. Although it is particularly true in the case of an extremely small-sized tuning fork, cracks may be caused near the folding line 22 due to folding in the rolling direction of the material, when the space "c" between the vibrating leg portions 24 and 24 is made small, with the resulting limitation that the space "c" cannot be made small.

SUMMARY OF THE INVENTION

The present invention can advantageously eliminate the disadvantages in such conventional examples as described hereinabove.

In short, a tuning fork of the present invention is obtained through folding of a material of invariable elasticity formed into a plate, wherein the plate is punched in a blank of an approximate V-shape and the blank is then folded at the linking portion of the bifurcate of the V-shape. In a preferred embodiment, the blank of a material of invariable elasticity is provided through punching of a plate formed by a rolling operation. The folding line is selected to cross the rolling direction. In a further preferred embodiment, the folding line is selected to cross the rolling direction at a right angle. The tuning fork is used in combination with an electrical mechanical conversion device.

In short, a manufacturing method of the tuning fork in accordance with the present invention comprises the steps of providing a material of invariable elasticity formed into a plate and sequentially punching the plate into a plurality of approximately V-shaped blanks. The punching process is performed by determining the punching positions of the blanks in the plate such that the V-shapes of the blanks are arranged in turn, with the inner edge of the bifurcate of a given V-shape blank contiguous to the outer edge of the bifurcate of the adjacent V-shape blank. The step of folding each of approximately V-shaped blanks punched in the same manner as described hereinabove at the linking portion of the bifurcate of the V-shape is carried out so that the bifurcate portions crossing in the V-shape may be folded to be faced to each other and to extend in parallel with each other. In a further preferred embodiment, a material of invariable elasticity formed in a plate by a rolling operation is provided and a punching operation is performed so that the folding line where each blank is folded may cross the rolling direction at a right angle.

Accordingly, an essential object of the present invention is to provide a tuning fork and a method of manufacturing the same which is superior in workability.

It is another object of the present invention to provide an improved structure of a tuning fork and a method of manufacturing the same which is capable of selectively determining the thickness of the tuning fork base portion.

It is further object of the present invention to provide an improved structure of a tuning fork and a method of manufacturing the same that can make the spacing between the vibrating bifurcate leg portions small, which is particularly suited for a small-sized tuning fork.

It is still another object of the present invention to provide a method of manufacturing a tuning fork which reduces the material loss.

These and other objects and features of the present invention will become more apparent from the following detailed description thereof when taken in conjunction with the preferred embodiment thereof with reference to the accompanying drawings.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1 is a perspective view of a first typical conventional tuning fork of interest to the invention;

FIG. 2 is a perspective view for illustrating a machining process of the tuning fork of FIG. 1;

FIG. 3 is a perspective view of a second typical conventional tuning fork of interest to the invention;

FIG. 4 is a perspective view for illustrating a process of machining the tuning fork of FIG. 3;

FIG. 5 is a perspective view illustrating one embodiment of the present invention;

FIG. 6 is a side view of the tuning fork of FIG. 5;

FIG. 7 is a perspective view illustrating the bending operation of the tuning fork of FIG. 5;

FIG. 8 is a plane view illustrating the punching operation of the tuning fork of FIG. 5;

FIG. 9 is a perspective view showing the tuning fork tip of FIG. 5 provided with a piezo-electric device; and FIG. 10 is a perspective view of a finished product of the FIG. 9 piezo-electric tuning fork with a case cap being installed thereon.

DESCRIPTION OF THE PREFERRED EMBODIMENTS

Referring to FIGS. 5 and 8, a tuning fork 30 is formed of a V-shaped blank having bifurcate sections, such that the central line of the angle between the bifurcate sections extends in the direction orthogonal to the rolling direction "a". As shown in FIG. 8, the blanks 31 are sequentially punched out of one plate material. More specifically, the punching operation is performed in sequence by determining the punching positions of the blanks in the plate such that the V-shapes of the blanks are arranged, with the inner edge of the bifurcate of a given blank 31 and the outer edge of the bifurcate of the adjacent blank 31 being positioned on the same cutting line. In this manner, the material loss is extremely reduced. The blank 31 is then folded at the linking portion of the bifurcate of the V-shape along a folding line 32 extending along the central line of the angle between the bifurcate of the V-shape and selected to cross the rolling direction "a" at a right angle, thereby to provide a tuning fork 30 including the leg portions 34 and 34 faced to each other and extending in parallel with each other as shown in FIGS. 5 and 6.

The tuning fork 30 obtained in the above-described manner has the folding line 32 extending in the direction diagonal to the directions of the bifurcate vibrating leg portions 34 and 34, whereby the portion including the folding line 32 forms or linking the base portion 33. The thickness or the length "b" of the base or linking portion 33 in the leg length direction does not depend upon the thickness of the blank 31 per se, but can be set as desired through proper selection of the angle of the bifurcate of the V-shape of the blank 31 and of the width of the blank 31. Since the folding line 32 has been selected to cross the rolling direction "a" at a right angle, the spacing "c" between the bifurcate leg portions can be made as small as necessary without causing cracks. On the other hand, since the direction along which the vibrating leg portions 34 extend is substantially the same as the rolling direction "a", the larger strength of the vibrating leg portions 34 can be realized. As in the case of the base portion 23 such as that of FIG. 3, if and when the end edges 25 of the base portion 23 are separated from each other, then the mechanical strength becomes smaller, and thus the base portion is liable to be deformed due to the external impacts. On the other hand, since the base portion 33 shown in FIGS. 5 and 6 is integral from one end to the other, the mechanical strength is greater and thus the base portion is not deformed due to the external impacts.

In the above described embodiment, the folding line 32 crosses the rolling direction "a" at a right angle. However, the folding line 32 is not required to cross the rolling direction "a" just at the right angle, but may cross it at any angle, insofar as the folding line crosses the rolling direction "a". By way of another example, the plate material may be formed without rolling. Accordingly, it can be said that an angle at which the above-described rolling direction "a" intersects the folding line 32 is optional.

The tip end shape of the bifurcate vibrating leg portions 34 is not limited to only a case where the end portion is terminated in the direction orthogonal to the longitudinal direction of the bifurcate vibrating leg portion, but the end portion may be formed in any other optional shapes. For example, the end portion shape may be formed as shown in a two-dotted line "d" in FIG. 6. In this manner, the blank 31 is adapted to have such end portion shape as shown in the two-dotted line "d" in FIG. 8, in which case the material loss can be further reduced.

As described hereinabove, the tuning fork of the present invention is advantageous particularly to the extremely small-size. Such extremely small-sized tuning fork is used in combination with a piezo-electric device in various circuits, as to be described hereinafter.

Referring to FIGS. 9 and 10, the tuning fork 30 is disposed above a base 41. The base portion 33 is secured to one end of a common terminal 42 which is fixedly provided through the base 41. The above described common terminal 42 extends from inside of the folding line at the base portion 33. Piezo-electric layers 43 and 43 (one of the piezo-electric layers 43 and 43 is provided on the surface of the opposite side of the bifurcate vibrating leg portion 31) are formed, for example by a sputtering method, on the outside surfaces of the bifurcate vibrating leg portions 31 and 31 of the tuning fork 30, respectively. Electrodes 44 and 44 are formed, for example by a masking method, on the surface of the respective piezo-electric layers 43. The electrodes 44 and 44 are electrically connected to terminals 46 and 46, respectively, which are downwardly projected from the base 41 by wire bondings 45 and 45. One of the terminals 46 and 46 becomes a terminal for the driving operation, while the other thereof becomes a terminal for the detecting operation.

A case cap 47 is placed, as shown in FIG. 10, on the base 41 with the tuning fork 30 retained thereon as described hereinabove. The case cap 47 is secured to the base 41. The case cap 47 serves to retain the tuning fork 30 placed within the case cap in an airtight compartment to prevent contact with external dust and so on, thus resulting in improved reliability.

Referring to the embodiment shown in FIGS. 9 and 10, the piezo-electric device is used as an electrical mechanical conversion device, which converts an electric signal to a mechanical vibration to transfer the signal to the tuning fork 30 and converts a mechanical signal of the tuning fork 30 to an electric signal. However, an electrical mechanical conversion device of electromagnetic energy may be used in place of such piezo-electric device.

Although the present invention has been described and illustrated in detail, it is to be clearly understood that the same is by way of illustration and example only and is not to be taken by way of limitation, the spirit and scope of the present invention being limited only by the terms of appended claims.

What is claimed is:

1. A tuning fork made of a folded blank of a bifurcate shape having a single linking portion and two finger portions extending from said single linking portion in bifurcate directions, said blank cut from a plate material of invariable elasticity formed through a rolling operation resulting in a residual stress in the rolling direction in said plate material, said blank being folded along a single folding line corresponding to said single linking portion of said blank along a central line at an angle between both said two finger portions of said blank, so that both said two finger portions may be folded to face each other to extend in parallel with each other, said folding line of said blank being selected to cross said rolling direction in said plate material at a given angle.

2. A tuning fork in accordance with claim 1, wherein said given angle is selected to be substantially a right angle.

3. A tuning fork in accordance with claim 2, wherein said blank of a bifurcate shape having a single linking portion and two finger portions extending from said single linking portion in bifurcate directions comprises a unitary V-shaped blank.

4. A tuning fork in accordance with claim 3, which further comprises a common terminal from an inner side of the folded portion where the blank is folded along a single folding line.

5. A tuning fork in accordance with claim 4, which further comprises a base for supporting said common terminal and said common terminal extending through said base, said base extending in parallel with the extending directions of said two finger portions, and a cap case for housing said tuning fork for covering the surface of said base where said tuning fork is disposed.

6. A tuning fork in accordance with claim 1, which further comprises electrical mechanical converting means operatively coupled to said bifurcate finger portions of said blank.

7. A tuning fork in accordance with claim 6, wherein said electrical mechanical conversion device comprises a piezo-electric device provided on said bifurcate leg portion and an electrode formed on the surface of said piezo-electric device.

8. A tuning fork in accordance with claim 6, wherein said electrical mechanical conversion device comprises electromagnetic energy conversion means.

9. A tuning fork comprising:
a blank cut from a plate material of invariable elasticity formed through a rolling operation resulting in a residual stress in the rolling direction in said plate material, said blank being cut in a substantially V-shape
said blank being of a bifurcate shape having a single linking portion and two finger portions extending from said single linking portion in bifurcate directions and said blank being folded along a single folding line corresponding to said single linking portion of said blank which extends along a portion which connects the finger portions of the V-shape blank;
said two finger portions of said folded blank extending in parallel with each other;
said folding line of said blank being disposed at a right angle to said rolling direction in said plate material; and
a base for supporting a common terminal extending from an inner side of said folded portion of said blank, said common terminal extending through said base and said base extending in parallel with the extending directions of said two finger portions.

* * * * *